United States Patent
McIntyre et al.

(10) Patent No.: US 8,889,454 B2
(45) Date of Patent: Nov. 18, 2014

(54) MANUFACTURE OF THERMOELECTRIC GENERATOR STRUCTURES BY FIBER DRAWING

(71) Applicants: Timothy J. McIntyre, Farragut, TN (US); John T. Simpson, Clinton, TN (US); David L. West, Oak Ridge, TN (US)

(72) Inventors: Timothy J. McIntyre, Farragut, TN (US); John T. Simpson, Clinton, TN (US); David L. West, Oak Ridge, TN (US)

(73) Assignee: UT-Battelle, LLC, Oak Ridge, TN (US)

( * ) Notice: Subject to any disclaimer, the term of this patent is extended or adjusted under 35 U.S.C. 154(b) by 0 days.

(21) Appl. No.: 13/672,446

(22) Filed: Nov. 8, 2012

(65) Prior Publication Data

US 2013/0306122 A1   Nov. 21, 2013

Related U.S. Application Data

(60) Provisional application No. 61/556,845, filed on Nov. 8, 2011.

(51) Int. Cl.

| | | |
|---|---|---|
| *H01L 35/34* | (2006.01) |
| *C03B 37/027* | (2006.01) |
| *C03B 37/012* | (2006.01) |
| *C03B 37/028* | (2006.01) |
| *H01L 35/32* | (2006.01) |
| *H01L 35/28* | (2006.01) |

(52) U.S. Cl.
CPC ............ *H01L 35/34* (2013.01); *C03B 37/0279* (2013.01); *C03B 37/0122* (2013.01); *C03B 37/028* (2013.01); *H01L 35/32* (2013.01); *H01L 35/28* (2013.01); *C03B 37/01214* (2013.01)

USPC .............................................. 438/54; 136/201

(58) Field of Classification Search
CPC ............................. H01L 35/34; H01L 35/325
USPC ........................................................... 438/54
See application file for complete search history.

(56) References Cited

U.S. PATENT DOCUMENTS

| | | | | |
|---|---|---|---|---|
| 5,817,188 | A  * | 10/1998 | Yahatz et al. | 136/237 |
| 6,112,395 | A  * | 9/2000  | Quick et al.  | 29/419.1 |
| 6,492,585 | B1   | 12/2002 | Zamboni et al. | |
| 6,660,925 | B1   | 12/2003 | Sharp | |
| 6,882,786 | B1 * | 4/2005  | Kliner et al. | 385/115 |
| 6,898,357 | B2 * | 5/2005  | Han et al. | 385/122 |
| 7,098,393 | B2 * | 8/2006  | Fleurial et al. | 136/240 |
| 7,559,215 | B2 * | 7/2009  | Dutta et al. | 65/442 |
| 7,767,564 | B2 * | 8/2010  | Dutta | 438/585 |

(Continued)

FOREIGN PATENT DOCUMENTS

| | | |
|---|---|---|
| JP | 61-201484       | 9/1986 |
| WO | WO 2007/070299 A2 | 6/2007 |

OTHER PUBLICATIONS

Melissa S. Sander, Amy L. Prieto, Ronald Gronsky, Timothy Sands and Angelica M. Stacy, Fabrication of High-Density, High Aspect Ratio, Large-Area Bismuth Telluride Nanowire Arrays by Electrodeposition . . . , Advanced Materials v.14:9, pp. 665-667, 2002.

(Continued)

*Primary Examiner* — Earl Taylor
(74) *Attorney, Agent, or Firm* — Pauley Petersen & Erickson

(57) ABSTRACT

Methods of manufacturing a thermoelectric generator via fiber drawing and corresponding or associated thermoelectric generator devices are provided.

10 Claims, 3 Drawing Sheets

(56) References Cited

U.S. PATENT DOCUMENTS

| | | | |
|---|---|---|---|
| 8,143,151 B2* | 3/2012 | Dutta | 438/585 |
| 2003/0047204 A1* | 3/2003 | Fleurial et al. | 136/200 |
| 2004/0261829 A1* | 12/2004 | Bell | 136/200 |
| 2006/0032526 A1* | 2/2006 | Fukutani et al. | 136/205 |
| 2006/0048809 A1* | 3/2006 | Onvural | 136/212 |
| 2006/0118158 A1* | 6/2006 | Zhang et al. | 136/205 |
| 2007/0131266 A1* | 6/2007 | Dutta | 136/201 |
| 2007/0131269 A1* | 6/2007 | Dutta | 136/230 |
| 2007/0245774 A1* | 10/2007 | Dutta | 65/393 |
| 2008/0245397 A1 | 10/2008 | Moczygemba et al. | |
| 2009/0090409 A1 | 4/2009 | Moczygemba | |
| 2009/0093078 A1 | 4/2009 | Moczygemba | |
| 2013/0306122 A1* | 11/2013 | McIntyre et al. | 136/205 |

OTHER PUBLICATIONS

James L. Bierschenk, "Optimized Thermoelectrics for Energy Harvesting Applications", Energy Harvesting Technologies, Chapter 12, ed. by S. Priya and D.J. Inman, Springer Science+Business Media, LLC, 2009.

* cited by examiner

MANUFACTURE OF THERMOELECTRIC GENERATOR STRUCTURES BY FIBER DRAWING

CROSS REFERENCE TO RELATED APPLICATIONS

This application claims the benefit of and priority to U.S. Provisional Application No. 61/556,845, filed 8 Nov. 2011, the entirety of which application is incorporated herein by reference.

GOVERNMENT RIGHTS

This invention was made with government support under DE-ACO5-000R22725 awarded by the U.S. Department of Energy. The government has certain rights in the invention.

FIELD OF THE INVENTION

The present invention relates to fabrication of thermoelectric generator structures by fiber drawing.

BACKGROUND OF THE INVENTION

Thermoelectric generators (also sometimes referred to as "TE generators" or "thermogenerators") are devices which convert heat (temperature differences) directly into electrical energy, using a phenomenon called the "Seebeck effect" (or "thermoelectric effect").

Older such devices used bimetallic junctions and were typically more bulky than desired. More recent such devices use semiconductor p and n junctions, such as of bismuth telluride ($Bi_2Te_3$), lead telluride (PbTe), or other materials such as known in the art and can have thicknesses in the millimeter range. These are typically solid state devices and unlike dynamos have no moving parts, with perhaps the occasional exception of a fan.

Thermoelectric generators are generally constructed from pairs of thermoelements, usually heavily doped p- and n-type semiconductors, connected electrically in series but thermally in parallel. One thermal connection is to a heat sink, and the other to a heat source. An electrical current across a load connected in series with the generator can be produced if there is a temperature difference between the heat source and the heat sink.

The Figure of merit (ZT) commonly used to measure the efficiency of a thermoelectric (TE) material is given by:

$$ZT = (\alpha^2/\kappa\rho)T \qquad (1)$$

where T is the average operating temperature in Kelvin (K), $\alpha$ is the material's Seebeck coefficient in Volts/K, $\kappa$ is the material's thermal conductivity in Watts/(m·K) and $\rho$ is the material's electrical resistivity in Ohm·$m^2$. The ZT is a material property, and is not affected by device design.

Thermoelectric generators are solid state heat engines and can provide electrical power from any heat source that is above the ambient temperature of the surroundings. Thus, rather than relying on the purchasing and supplying of fuel, a thermoelectric generator can provide its fuel from any device or machine that creates and releases substantial amounts of heat, e.g., what in many cases would more commonly be referred to as "waste heat."

In many situations involving energy harvesting from waste heat with thermoelectric generators, however, the thermal gradients (often called ΔT) can be small. Bierschenk, in "Optimized Thermoelectrics For Energy Harvesting Applications," Ch. 12 in *Energy Harvesting Technologies*, ed. by S. Priya and D. J Inman, Springer, 2009, has described various advantages that can be realized via the use of high-junction number, high-aspect ratio thermoelectric generators in such applications.

In view of the above, there exists a need and a demand for such high aspect ratio thermoelectric generator devices as well as methods or techniques to produce or manufacture such thermoelectric generator devices.

SUMMARY OF THE INVENTION

A thermoelectric generator according to one embodiment of the invention is constructed by drawing a thermoelectric (TE) or other suitable core material inside a glass perform to simultaneously elongate and decrease a diameter of the preform and to form an elongated glass-clad structure. These drawn structures are preferably cut, bundled and redrawn to simultaneously elongate and decrease a diameter of the bundled structure. Alternating n- and p-type TE material-containing drawn structures can be arranged in the bundled structure to facilitate subsequent electrical connection in series to form a thermoelectric generator.

In certain embodiments, as disclosed directly above, the thermoelectric material has a sufficiently low melting point that it can be successfully drawn as a core in a glass fiber.

In embodiments where melting point (or other) considerations do not permit successful drawing of the glass cladding and selected thermoelectric material, a fugitive core can be employed through the drawing process. The fugitive core can be removed by subsequent processing and replaced by the selected thermoelectric material such as added via deposition.

BRIEF DESCRIPTION OF THE DRAWINGS

The above-mentioned and other features and objects of this invention will be better understood from the following detailed description taken in conjunction with the drawings wherein.

DETAILED DESCRIPTION OF THE INVENTION

Figure 1:
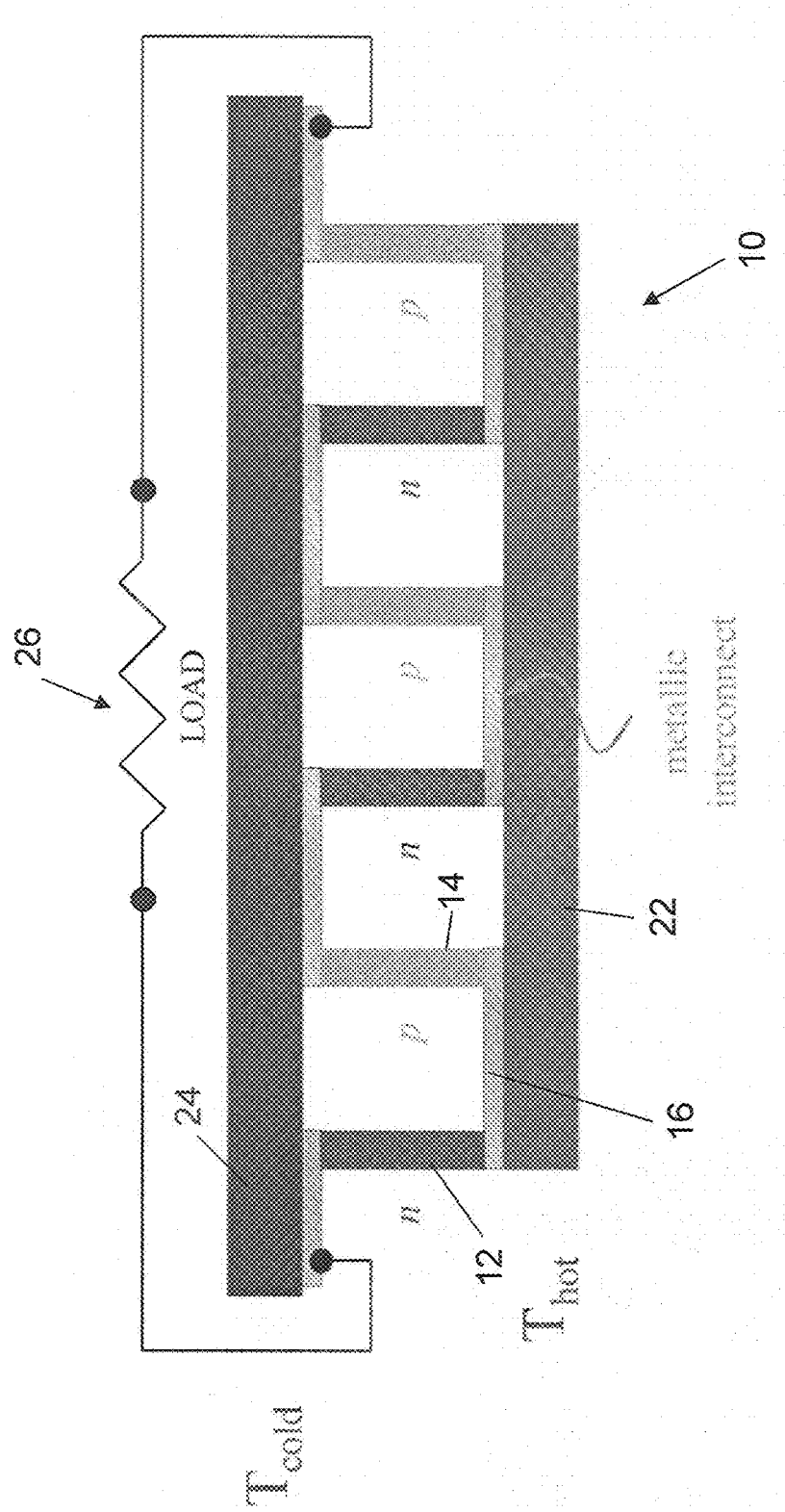
FIG. 1 is a schematic illustration of a thermoelectric generator in accordance with one embodiment of the invention and viewed in a plane parallel to the thermal gradient.

It is the object of the present invention to produce high aspect ratio thermoelectric devices by fiber drawing.

Fiber drawing is a process whereby a glassy material is drawn through a heated pre-form, resulting in a simultaneous elongation and reduction in cross-sectional area. It can be suited to producing high aspect thermoelectric devices because it is a means of producing lengths of glass-clad material, the glass forming an electrically insulating layer around a thermoelectric material core such as bismuth telluride ($Bi_2Te_3$). It is also possible to draw fiber bundles, with many fibers being drawn simultaneously into one multi-cored fiber.

Application of this technique to produce high-junction number, high-aspect ratio thermoelectric structures can proceed along several different paths, two of which will be described here. In the first, the thermoelectric material has a sufficiently low melting point $T_m$ (for example, $T_m$ of $Bi_2Te_3$ is about 573° C.) that it can be drawn as a core in a glass fiber. The first step would then be to draw a length of glass-clad thermoelectric material that could be chopped, bundled, and redrawn. If melting point (or other) considerations do not permit simultaneous drawing of the glass cladding and the selected thermoelectric material, a fugitive core can be employed in its place during the drawing process. This core can be subsequently removed and replaced, such as via deposition, by the selected thermoelectric material. For example, the fugitive core could be a metal, such as copper and such as can be attacked or otherwise removed by nitric acid, or some other material that that can be otherwise appropriately removed and replaced with a selected thermoelectric material. A deposition process suitable for $Bi_2Te_3$ into hollow core structures has been described by Sander, M. S. et al., "Fabrication of High-Density, High Aspect Ratio, Large-Area Bismuth Telluride Nanowire Arrays by Electrodeposition Into Porous Anodic Alumina Templates," *Advanced Materials*, 14[9], pp 665-7, 2002.

It is important to note that the thermoelectric generator needs alternating n- and p-type materials, as shown schematically in FIG. 1. The first of the techniques described above could be employed to build such a structure by first drawing n- and p-type fibers, chopping, assembling, and re-drawing such that the n- and p-type TE materials can be easily connected electrically in series via metallic interconnects to form a thermoelectric generator 10. As shown in FIG. 1, the thermoelements, n-type 12 and p-type 14, are connected electrically in series via metallic interconnects 16 but thermally in parallel. One junction is heated (e.g., adjacent or in thermal communication with a surface, element or heat source 22, such as designated $T_{hot}$), while the other is cooled (e.g., adjacent or in thermal communication with a surface, element or heat sink 24, such as designated $T_{cold}$), and an electrical current across a load 26 connected in series with the generator is produced based on the temperature differences between the heat source 22 and the heat sink 24.

Figure 2:
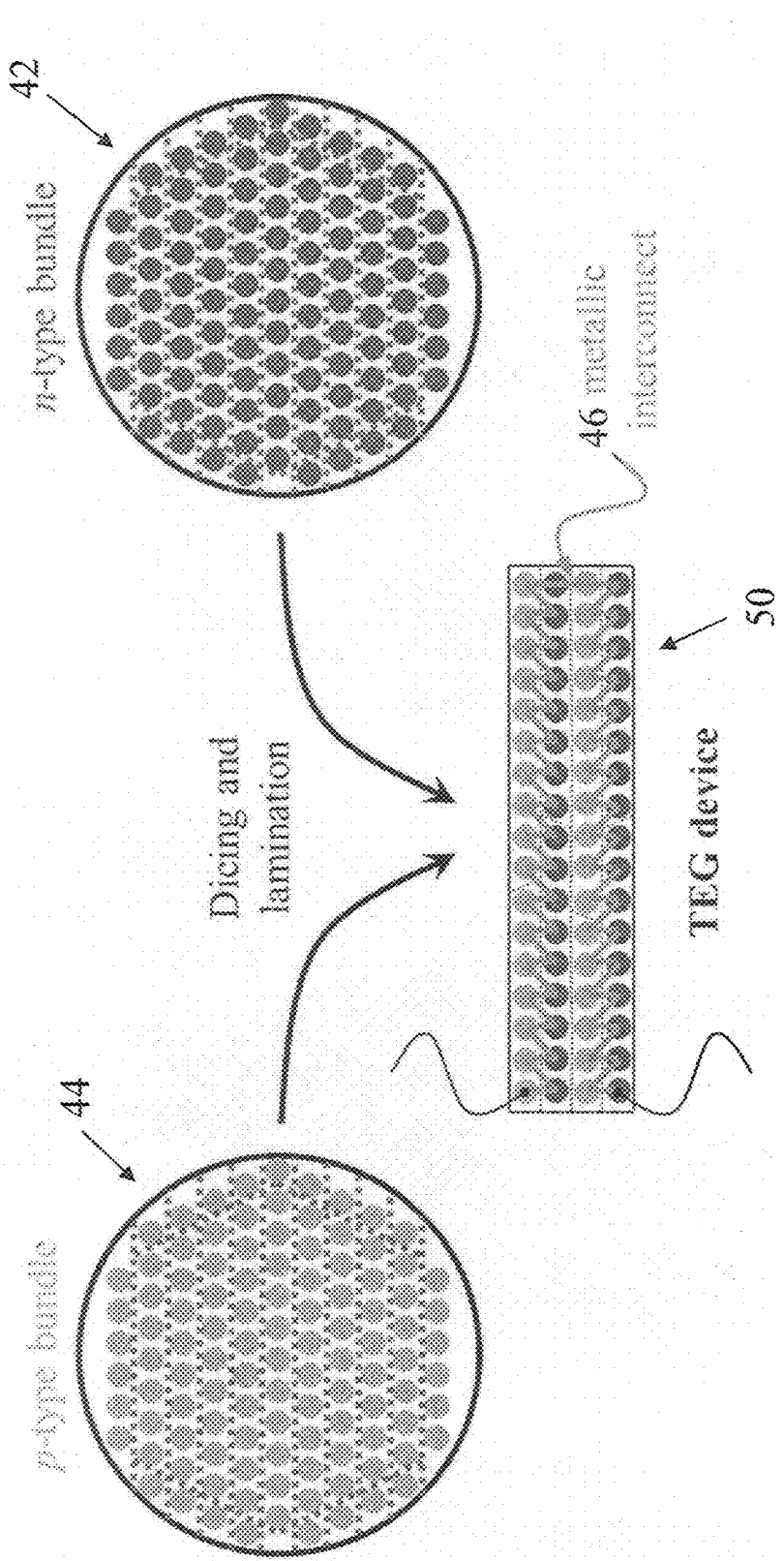
FIG. 2 is a schematic illustration of dicing and laminating n- and p-type bundles to result in a structure in which the n- and p-type thermoelectric materials can readily be electrically connected in series such as by a metal interconnect, this view being in a plane perpendicular to the thermal gradient.

However if the second of the techniques described above is used this will lead to a bundle of chemically identical high aspect ratio thermoelectric structures. In this case the desired geometry can still be obtained by dicing chemically identical bundles of n-type 42 and p-type fibers 44, respectively, and subsequently laminating as shown in FIG. 2. For example, layered n-type 42 and p-type fibers 44 can be electrically connected in series such as via metallic interconnects 46 to form a thermoelectric generator device 50, as shown.

Figure 3:
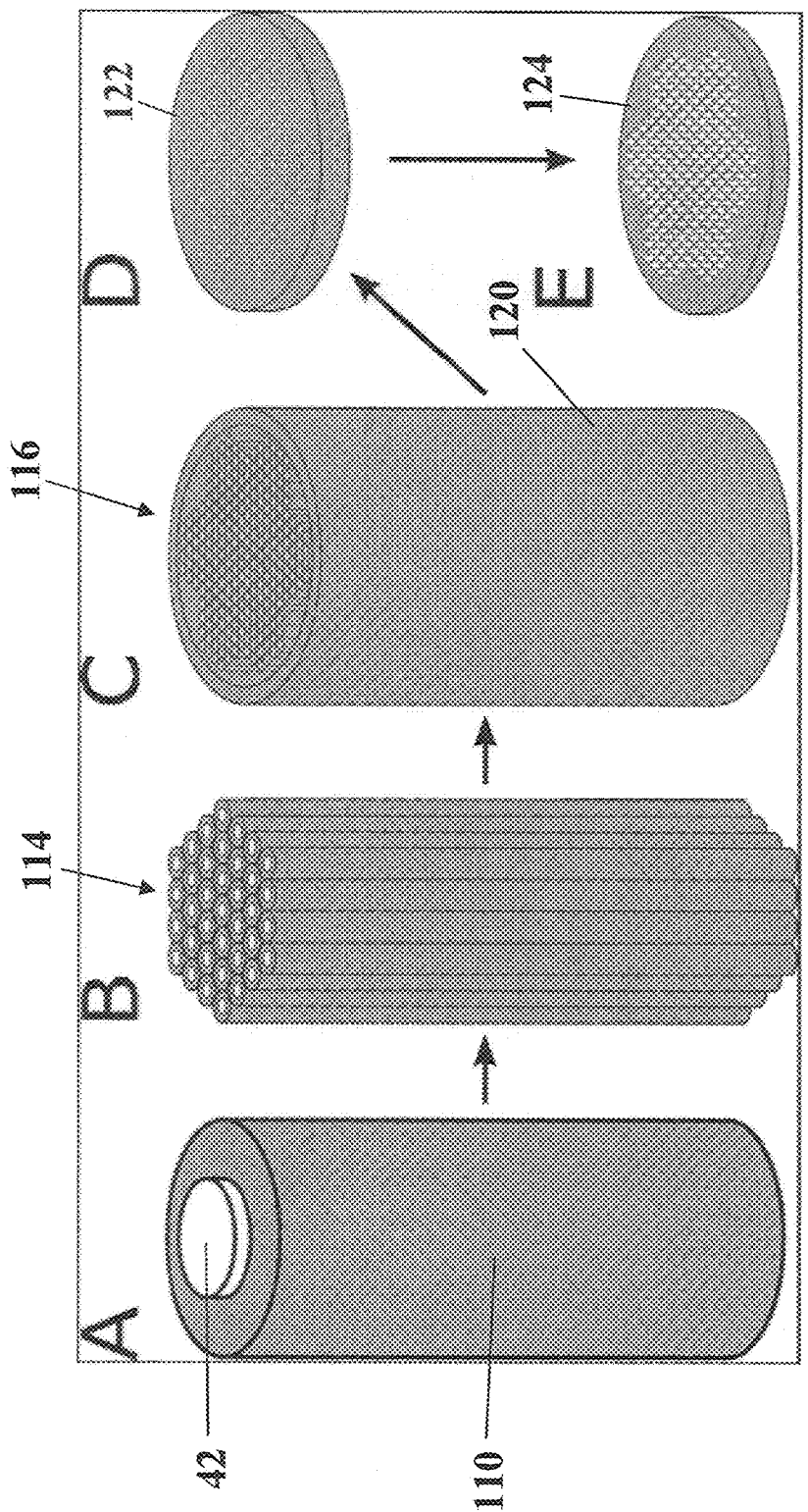
FIG. 3 is a schematic illustration of a fiber drawing and bundling process in accordance with one embodiment of the invention.

FIG. 3 illustrates a fiber drawing and bundling process in Steps A-E, in accordance with one embodiment of the invention. As shown, in Step A, a glass fiber surround 110 about a hollow core 112 is formed. In Step B, a plurality of such glass fibers about a hollow core are put together to form a bundle 114 and drawn. A selected number of such bundles can, such as shown in Step C, can be rebundled and/or consolidated 116, such as with an outer encapsulation 120, e.g., a sheet, tube or the like, such as formed of glass, for example, such as for increased physical strength or integrity. The rebundled fibers can then be appropriately redrawn and subsequently sliced into wafers or discs 122, as shown in Step D.

As will be appreciated, the appropriate incorporation of a selected thermoelectric material within the hollow cores can occur at various points in the fiber drawing and bundling process. For example, such incorporation of a thermoelectric material can occur during initial drawing, after initial drawing, before bundling, after bundling, before redrawing, during redrawing, after redrawing, before rebundling, after rebundling, before slicing and after slicing, such as may be desired in a particular application.

The sliced wafers or discs 124, now appropriately containing thermoelectric material within a glass-clad structure such as shown in Step E, can be electrically connected in series such as via metallic interconnects to form a thermoelectric generator device, such as described above.

In accordance with certain embodiments, the invention permits 100 micron core arrays and 50 micron core arrays, respectively, for example.

The invention permits the manufacture of dense concentrations of junctions, e.g., a large number of junctions per a unit area. For example, the invention can permit the manufacture of concentrations of one million or more cores (junctions) in a 1 inch diameter bundle.

Various thermoelectric materials, such as known in the art and for example including PbTe and $Bi_2Te_3$, can be used in the practice of the invention. While, thermoelectric materials with higher efficiency ZT may be generally preferred, those skilled in the art and guided by the teachings herein provided will appreciate that the broader practice of the invention is not necessarily limited to use of or with specific or particular thermoelectric materials.

Although the above techniques were disclosed in relation to producing high-junction number, high-aspect ratio structures for low $\Delta T$ applications they may also be suitable for the production of thermoelectric structures for other applications.

Thus, the invention provides thermoelectric generators of a design and configuration with or in high-junction number, high-aspect ratio, and high efficiency as well as methods for low-cost and/or high-volume manufacture thereof. Those skilled in the art and guided by the teachings herein provided will understand and appreciate that thermoelectric generator devices made in accordance with the present invention can effectively scavenge and utilize energy from what typically has been classified as low-quality (small thermal gradient) waste heat sources, such waste heat sources heretobefore normally having been considered to be unusable. The resulting scavenged energy can have various applications including, for example, to power remote devices, low level lighting, wireless sensors, and other energy-saving and/or low demand devices.

The invention illustratively disclosed herein suitably may be practiced in the absence of any element, part, step, component, or ingredient which is not specifically disclosed herein.

While in the foregoing detailed description this invention has been described in relation to certain preferred embodiments thereof, and many details have been set forth for purposes of illustration, it will be apparent to those skilled in the art that the invention is susceptible to additional embodiments and that certain of the details described herein can be varied considerably without departing from the basic principles of the invention.

What is claimed is:

1. A method of manufacturing a thermoelectric generator, the method comprising:
   drawing a core material inside a glass preform to simultaneously elongate and decrease a diameter of the preform and to form a glass clad structure, wherein the glass clad structure comprises a glass clad fugitive core;
   cutting the glass clad structure to form glass clad structures of reduced length;

bundling the glass clad structures of reduced length;

drawing the bundled glass clad structures of reduced length to simultaneously elongate and decrease a diameter of the bundled glass clad structures to form drawn glass clad structures;

arranging alternating n- and p-type thermoelectric material containing drawn glass clad structures, wherein the thermoelectric material containing drawn glass clad structures comprise a thermoelectric material not permitting simultaneous drawing of the glass clad structure and the thermoelectric material;

electrically connecting the alternating n- and p-type thermoelectric material containing drawn glass clad structures in series to form a thermoelectric generator; and replacing the fugitive core with a thermoelectric material following at least one of the preceding steps.

2. The method of claim 1 wherein the glass clad structure comprises a glass clad thermoelectric material core.

3. The method of claim 2 wherein the thermoelectric material core comprises a thermoelectric material having a sufficiently low melting point to permit the thermoelectric material to be drawn as a core in a glass clad structure.

4. The method of claim 3 wherein the thermoelectric material comprises bismuth telluride.

5. The method of claim 1 wherein the thermoelectric material core comprises a thermoelectric material having a sufficiently high melting point to not permit simultaneous drawing of the glass clad structure and the thermoelectric material.

6. The method of claim 1 wherein said arranging alternating n- and p-type thermoelectric material containing drawn glass clad structures comprises laminating alternating layers of n- and p-type thermoelectric material containing drawn glass clad structures respectively.

7. The method of claim 1 comprising separately drawing n- and p-type thermoelectric material containing drawn glass clad structures.

8. The method of claim 1 wherein the thermoelectric material comprises bismuth telluride.

9. A method of manufacturing a thermoelectric generator, the method comprising:

drawing a fugitive core material inside a glass preform to simultaneously elongate and decrease a diameter of the preform and to form a glass clad structure having a fugitive core;

cutting the drawn glass clad structure to form glass clad structures of reduced length;

bundling the glass clad structures of reduced length;

drawing the bundled glass clad structures of reduced length to simultaneously elongate and decrease a diameter of the bundled glass clad structures;

replacing the fugitive cores of the glass clad structures with a thermoelectric material following at least one of the preceding steps;

arranging alternating n- and p-type glass clad structures containing the thermoelectric material replacing a respective fugitive core; and electrically connecting the alternating n- and p-type glass clad structures containing the thermoelectric material in series to form a thermoelectric generator.

10. The method of claim 9 wherein the thermoelectric material comprises bismuth telluride.

* * * * *